(12) United States Patent
Boufounos

(10) Patent No.: US 9,337,815 B1
(45) Date of Patent: May 10, 2016

(54) METHOD FOR COMPARING SIGNALS USING OPERATOR INVARIANT EMBEDDINGS

(71) Applicant: Mitsubishi Electric Research Laboratories, Inc., Cambridge, MA (US)

(72) Inventor: Petros T Boufounos, Arlington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 14/643,153

(22) Filed: Mar. 10, 2015

(51) Int. Cl.
*H03K 5/22* (2006.01)
*H03K 5/125* (2006.01)

(52) U.S. Cl.
CPC .................................... *H03K 5/125* (2013.01)

(58) Field of Classification Search
CPC ....... H03K 5/2481; H03K 5/249; H03K 5/24; H03K 5/2418; G01R 19/0038
USPC ...................................... 327/63–71; 702/189
See application file for complete search history.

(56) References Cited

U.S. PATENT DOCUMENTS

| 7,035,775 | B2 * | 4/2006 | Abe et al. ....................... 702/189 |
| 2007/0144335 | A1 * | 6/2007 | Derboven et al. ............... 84/613 |
| 2009/0100990 | A1 * | 4/2009 | Cremer et al. .................. 84/623 |
| 2010/0208079 | A1 * | 8/2010 | Wei ............................. 348/180 |

OTHER PUBLICATIONS

Scattering Representations for Recognition, Bruna J., Ph.D. thesis, Ecole Polytechnique, Palaiseau, France, Nov. 2012.
Classification with Scattering Operators, Bruna J. and Mallat S., Computer Vision and Pattern Recognition (CVPR), 2011 IEEE Conference on, pp. 1561-1566, 2011.
Group Invariant Scattering, Mallat S., Communications in Pure and Applied Mathematics, vol. 65, No. 10, pp. 1331-1398, Oct. 2012.
Magic Materials: a theory of deep hierarchical architectures for learning sensory representations Anselmi F., J.Z. Leibo, L. Rosasco, J. Mutch, A. Tacchetti, and T. Poggio, CBCL paper, Massachusetts Institute of Technology, Cambridge, MA, May 7, 2013.

* cited by examiner

*Primary Examiner* — Quan Tra
(74) *Attorney, Agent, or Firm* — Gennadiy Vinokur; James McAleenan; Hironori Tsukamoto

(57) ABSTRACT

A method for generating an embedding for a signal, which is invariant to an operator, by first measuring the signal with each vector from a set of measurement vectors to produce a corresponding set of coefficients, wherein the measuring compares and transforms each measurement vector and the signal using the operator. A set of one or more matching coefficients according to predefined criteria are selected. Then, the matching coefficients are combined to produce the embedding for the signal, wherein the embedding is operator invariant.

37 Claims, 8 Drawing Sheets

Inputs:
Transformation $T_\alpha(\cdot)$.
Parameter grid $\mathcal{G}$.
Dissimilarity or similarity function $d(\cdot,\cdot)$ or $s(\cdot,\cdot)$.
Measurement vectors $e_i, i = 1, \ldots, M$.
Input signal: $x$.

1: for each measurement vector $e_i$ do
2:    Compute optimal parameter:
$$\widehat{\alpha}_i = \arg\min_{\alpha \in \mathcal{G}} d(T_\alpha(e_i), x), \text{ or } \widehat{\alpha}_i = \arg\max_{\alpha \in \mathcal{G}} s(T_\alpha(e_i), x)$$
3:    Measure signal at optimal parameter:
$$y_i = \langle T_{\widehat{\alpha}}(e_i), x \rangle$$

Output: $y$ and (optional) $\widehat{\alpha}$

*Fig. 7*

METHOD FOR COMPARING SIGNALS USING OPERATOR INVARIANT EMBEDDINGS

FIELD OF THE INVENTION

This invention relates generally to signal processing, and more particularly to comparing signals subject to transformations.

BACKGROUND OF THE INVENTION

In many applications, it is desirable to compare signals, such as signals representing images, sound, or industrial automation signals that have undergone transformations. These transformations can include translation, rotation, scaling, etc. Furthermore, the signals can be parametrized with a parameter controlling some aspect of the transformation. For example, if the transformation is a rotation, then the parameter can be an angle of rotation. Similarly, if the transformation is translation, then the parameter can be an amount of translation.

There are several instances where such comparisons are necessary. For example, in many applications, it is necessary to identify a component of an image being processed, such as an image of a corner, a vehicle, or a face. To identify these components, an example or template, the image of the face or the car should be compared with the elements of the image being processed in order to be identified. However, the face or the car in the image being processed does not necessarily have the same scale, position, or orientation as the face or car in the example image.

Similarly, in many industrial applications it is desirable to compare signals, obtained from equipment monitoring sensors, with template signals, that are examples of proper equipment operation. When the signals are dissimilar, this is an indication of equipment malfunction, and an operator should be alerted. However, such signals are often translated in time (delayed), compared to the template signals.

There are several approaches in performing such comparisons. The most common is to compare a first signal with all the transformations of a second signal and select the the signal that matches best. The quality of this match indicates how similar the signals are under the transformation. One example of this approach is to determine the autocorrelation of the signals and select the peak of this autocorrelation, which is an approach very common in a number of applications. This comparison can often be performed "in-place," i.e., without explicitly determining all the transformations.

FIG. 1 is a schematic of a conventional signal comparison technique wherein signals 101-102 might be similar but transformed in some way, e.g., due to a translation in time. Alternatively, two signals 103-104 might be dissimilar even when the transformation is taken into account. It is desired to determine a distance metric that characterizes the similarity. For example, in one embodiment, the distance is a Euclidian distance. Typically, this is performed using the cross-correlation 110, which determines the correlation of the two signals under all the possible transformations (i.e., translation in time). This results to a corresponding signal distance 115 of the signals under all the transformations. From the cross-correlation and the corresponding distance a maximal correlation 111, and a corresponding minimal distance 116 are determined.

A problem with that approach is the inherent computational complexity when a single signal needs to be compared with more than one signals, e.g., stored in a database, to determine similarity. Because the comparison of pairs of signals essentially compares many signals, according to the various of transformations considered, and selects the best match. The computation can be significant, even when the comparison is "in-place." This issue is alleviated in an alternative invariant approaches described below.

One alternative approach is to further transform the original signals in a way that is invariant with respect to the original transformation. In other words, the transformed signals would be the same, even when the original signals have a different shift, rotation or scale, etc., according to the invariance desired. The transformed signals are subsequently compared and the output of this comparison is used to determine the similarity of the signals.

The transformation is typically much less computationally intensive than the comparing of all the pairs of signals as described above. Thus, the comparison of a signal with many signals in a database can be made much more efficient. On the other hand, one of the problems with the invariance approach is that, often, it is difficult or impossible to find a transformation with the appropriate invariance that also preserves sufficient information to perform meaningful comparisons.

A similar approach is to extract features from the signal that are invariant to the desired transformations, and not transform the entire signal. Then, the features are compared to determine a match. This is the approach taken in many popular image descriptors, such as a scale-invariant feature transform (SIFT) or a compressed histogram of gradients (CHoG), and other similar methods. The benefit of that approach is that it is easier to extract invariant descriptors than to transform the entire signal. The drawback is that these descriptors are usually designed with particular applications and tasks in mind, such as detecting objects in an image, and are tuned specifically for this task. For each different task, a different descriptor needs to be designed with the appropriate properties tuned to the task.

SUMMARY OF THE INVENTION

To overcome the above problems and to preserve computational efficiency, the embodiments of the invention provide a method for generating operator invariant embeddings. These embeddings provide a way to combine the benefits of conventional approaches without their drawbacks. The embeddings provide a feature extraction mechanism which, in contrast to conventional approaches, is generic and does not need to be designed specifically for each application or each type of signal.

Furthermore, if it is desired to preserve certain information derived from the embedding generation, the embedding can be considered as an operator-invariant transformation. In this case, the signal can be recovered from the embedding. The computation of the embedding can be determined by comparing the signal with a set of intermediate signals and all their transformations.

In the later case, each signal is compared with all the transformations of a small number of intermediate signals. These comparisons serve as a feature set that are compared with the features extracted from the other signals. Thus, the computational cost of comparing the signal with all the transformations of all the other signals is reduced because the exhaustive comparison only happens with the transformation of a few template signals. The outcome of this comparison is a feature, which is compared with the features extracted from all other signals, which is a much faster comparison.

BRIEF DESCRIPTION OF THE DRAWINGS

FIG. 7 is a pseudocode that corresponds to the schematic shown in FIGS. 3A and 3B according to an embodiment of the invention.

DETAILED DESCRIPTION OF THE PREFERRED EMBODIMENTS

Operator-Invariant Embedding

Figure 1:
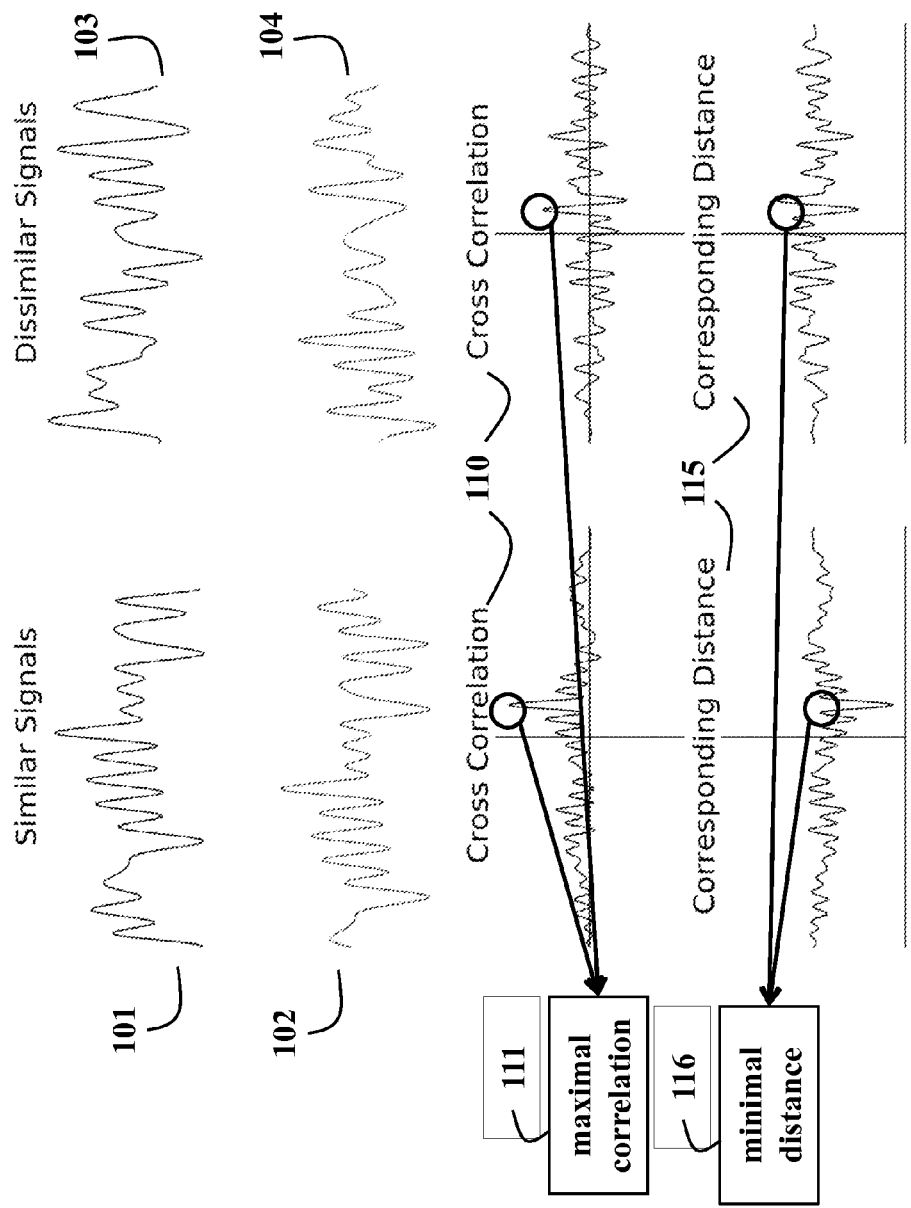
FIG. 1 is a schematic of a conventional signal comparison technique.
Figure 2:
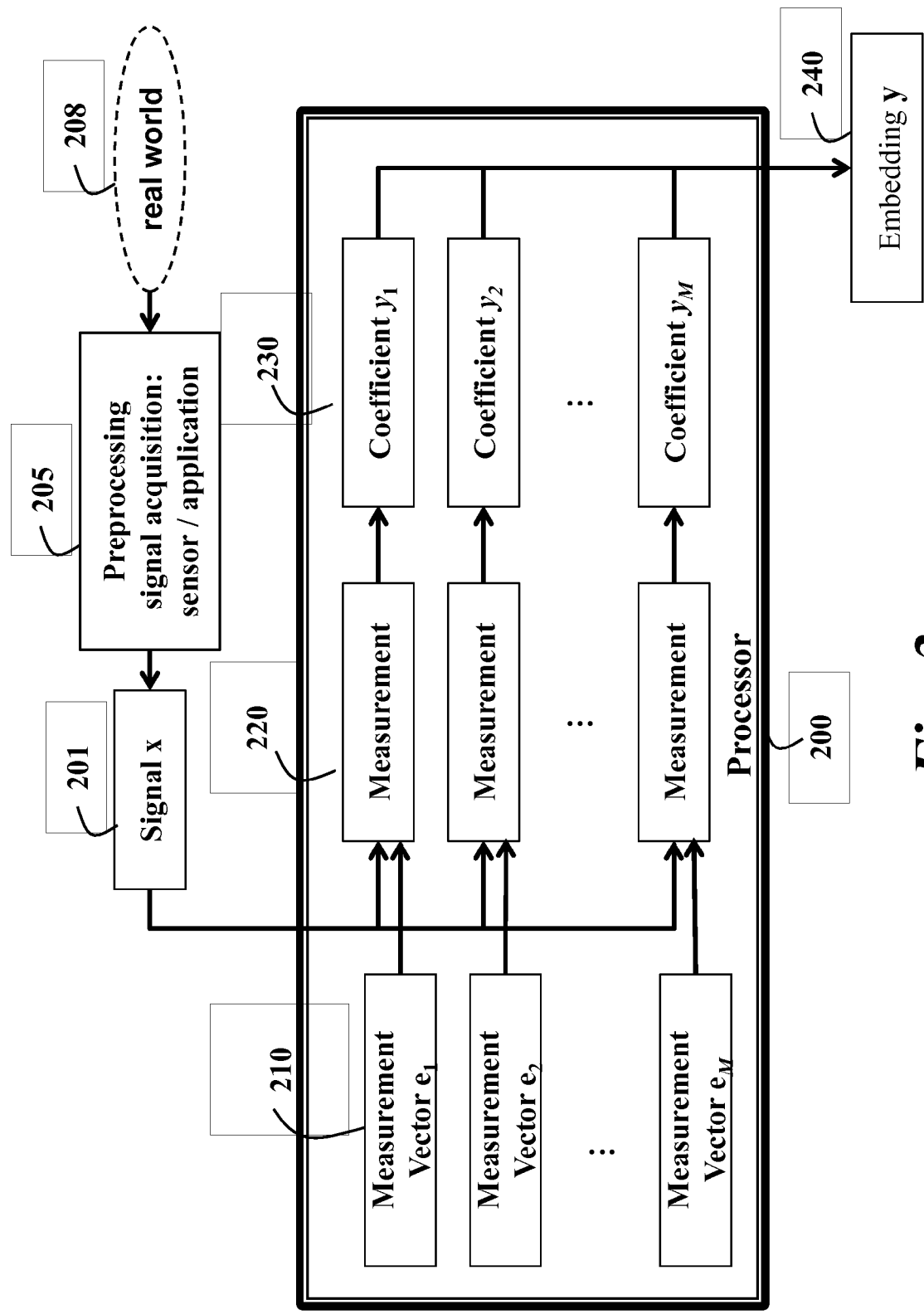
FIG. 2 is a schematic of a process to generate an embedding according to an embodiment of the invention.

FIG. 2 shows an embodiment of a method for generating an embedding for a signal which is invariant to an operator. Each of the measurements vectors $e_i$ 210 is used to measure an acquired signal x 201 and generate an embedding of x as y 240.

The signal can be acquired 205 in a preprocessing step using, e.g., a sensor 205, e.g., a cameras, a microphone, or other types of sensors. The signal can be a visual signal, e.g., an images or a videos, an audio signal, e.g., speech and music, or industrial automation signals. Alternatively, or additional the signal can be acquired by an application, e.g., an image or a speech processing application that extracts features from the signals. The signals can also be obtained by sensors sensing factory equipment, mechanical systems, electrical systems, such as power storage systems including batteries.

The signal 201 is measured with each of a set of measurement vectors $e_i$ 210 using a measurement process 220 to produce a set of corresponding coefficients 230. All the coefficients are combined in a vector to produce the embedding 240 y.

The method can be performed in a processor 200 connected to memory and input/output interfaces by buses as known in the art.

Subsequently, the embedding can be used to compare the similarity of signals as described below.

Signal Similarity

In order to compare two signals a similarity measure or a dissimilarity measure is often used. The similarity measure is high when the two signals are similar and low when the two signals are dissimilar. The dissimilarity measure is low when the signals are similar and high when the signals are dissimilar.

An example of a dissimilarity measure is a signal distance, which is a measure very commonly used in signal comparisons. Given two signals x, x'∈ $\mathcal{S}$, where $\mathcal{S}$ is the set of signals of interest, the $\ell_p$ distance is defined as $$d_{\ell_p}(x,x') = \|x-x'\|_p = (\Sigma_i |x_i - x_i'|^p)^{1/p}, \quad (1)$$

where p≥1. Very similar signals have small distance when the signals are similar, i.e., x=x', and the distance is zero.

If one signal is a multiple of the other, then the $\ell_p$ distance can be high, even though certain applications can consider those signals as the same. For that reason, an alternative similarity measure is often used, which comprises of first normalizing the signals, and then determining their $\ell_p$ distance. This measure is $$\tilde{d}_{\ell_p}(x,x') = \left\| \frac{x}{\|x\|_p} - \frac{x'}{\|x'\|_p} \right\|_p \quad (2)$$

Another class of useful similarity measures are divergences, which are similar to distances. For example, a Bregman divergence is often used to compare signals. A Bregman divergence may or may not satisfy neither the triangle inequality nor symmetry.

One of the most useful similarity measures is signal correlation c, defined as $$c(x,x') = \langle x, x' \rangle = \Sigma_i x_i x_i'. \quad (3)$$

As with distance measures, multiplication of signals by a scalar can affect their similarity as measured by the correlation measure. In such cases, the correlation coefficient, which uses the normalized signals, is $$\rho(x,x') = \left\langle \frac{x}{\|x\|_2}, \frac{x'}{\|x\|_2} \right\rangle. \quad (4)$$

In a number of applications, two signals that are the opposite of each other, i.e., x≈−x', or x≈−cx' for some c>0, should still be considered similar. In such applications, the magnitude of the correlation or the correlation coefficient, i.e., |c(x, x')| or |ρ(x, x')| is the more appropriate similarity measure of the signals.

An alternative similarity measure, often preferred, is based on functions known as radial basis kernels. Radial basis kernels have a defining property that the kernels are only a function of the distance $\|x-x'\|_p$ of two signals, i.e., the kernels are defined as $$K(x,x') = k(\|x-x'\|_p), \quad (5)$$

for some appropriate k(•) and p.

Two of the most commonl radial basis kernels are the Laplacian and the Gaussian kernel, defined as $$K_L(x,x') = e^{-c\|x-x'\|_1}, \quad (6)$$

and $$K_G(x,x') = e^{-c\|x-x'\|_2^2}, \quad (7)$$

respectively.

Of course, several other similarity measures exist and can be used in this subsequent development.

In order to design the operator-invariant embeddings according to the embodiments of the invention, in addition to the signals x, x', consider an operator $T_\alpha: \mathcal{S} \to \mathcal{S}$ that is parametrized by a parameter α. The embeddings are designed to be invariant to this operator. The operator $T_\alpha$ characterizes how a shift, scale change, rotation, etc., transforms a signal, such as an image. The operator can also characterize multiple transformations, e.g., both a rotation and a scale change, or a rotation and a shift, or all three.

The parameter α characterizes the specific properties of the transformation. For example, if the transformation is a rotation, then α may be the angle of rotation. If the transformation is a translation, then α may be the amount of translation. If the operator combines multiple transformations, then α may be a tuplet of parameters, as required for each transformation, e.g., includes both a translation and a rotation amount. The parameter $\alpha$ can take a range of values $\alpha \in \mathcal{R}$, e.g., in a rotation, where $\mathcal{R}$ can be the range of angles, from 0 to $2\pi$, or $-\pi$ to $\pi$.

For each value of the parameter $\alpha$, there is an inverse value $\hat{\alpha} \in \mathcal{R}$, depending on the transformation, which would invert $T_\alpha$, i.e., $T_{\hat{\alpha}}(T_\alpha(x))=x$. For example, the rotation by $\alpha$ to the right is inverted using a rotation by $\alpha$ to the left, i.e., a rotation by $-\alpha$ to the right, which is also equivalent to a rotation by $2\pi-\alpha$ to the right. Similarly, a scale change parameter $\alpha$ is inverted using a scale change by $1/\alpha$.

The embedding is also an operator, E: $\mathcal{S} \rightarrow \mathcal{V}$, where $\mathcal{S}$ is the signal space, as above, and $\mathcal{V}$ is the embedding space. Typically, the embedding space is $\mathcal{V}$ is $\mathbb{R}^M$ or $\mathbb{C}^M$ for some M. This operator is approximately invariant to $T_\alpha$, if $E(x) \approx E(T_\alpha(x))$ for all $\alpha \in \mathcal{R}$ and all $x \in \mathcal{S}$, with exact equality if $E(\bullet)$ is exactly invariant to $T_\alpha(\bullet)$.

A dissimilarity measure is generally denoted using $d(x,x')$, or a similarity measure $s(x,x')$, as appropriate for the application. Similarity has high value if x is similar to x' and low if not. Dissimilarity has low value if x
is similar to x' and high if not.

In order to generate $E(\bullet)$, a number of measurement vectors $e_i$, i=1, ..., M 210 are used. In typical embodiments, the vectors are generated randomly. Their number M depends on the application. For example, M can be based on a trade-off between speed and accuracy. A higher M gives higher accuracy. Generally, M should be much less than the dimensionality of the signal, and also can depend on the number of signals that will be compared. For example, in the database query and search application, as described below, M increases logarithmically with the number of signals in the database. Typical numbers depend on the application type. For example, when using the embedding to look for a template in an image, one would expect M to be less than a few hundred, typically less than 200.

Depending on what the signal space $\mathcal{S}$ is, the vectors can be generated in a number of ways. For example, the vectors can be generated using a uniform distribution on a unit sphere in $\mathcal{S}$. Or, if, for example, $\mathcal{S} \in \mathbb{R}^N$ or $\mathbb{C}^N$, then each $e_i$ can be generated as a random real or complex N-dimensional vector, with each vector component drawn from an i.i.d. real or complex normal distribution. Alternatively the distribution can be a uniform, Rademacher, or other subgaussian real or complex distributions.

Embodiments of the measurement process 220 are described in more detail with reference to FIGS. 3A and 3B.

In order to measure the signal 201 with the measurement process 220, an embodiment of the invention generates a sufficiently fine finite grid g from the parameter set, i.e., $\mathcal{G} \cup \mathcal{R}$, where $G = |\mathcal{G}| < \infty$ is the number of grid points. In general, the grid sufficiently fine if for all parameters $\alpha \in \mathcal{R}$, then $\sup_{\alpha' \in \mathcal{G}} |\alpha - \alpha'| \leq \epsilon$ for sufficiently small tolerance $\epsilon$. A similar guarantee, with multiple tolerance values, should be provided for a multiparameter grid, e.g., if a captures both translation and rotation. In most implementations, the grid would contain parameters and their inverse, i.e., $\alpha \in \mathcal{G} \Leftrightarrow \hat{\alpha} \in \mathcal{G}$, although this is not necessary.

Figure 3A:
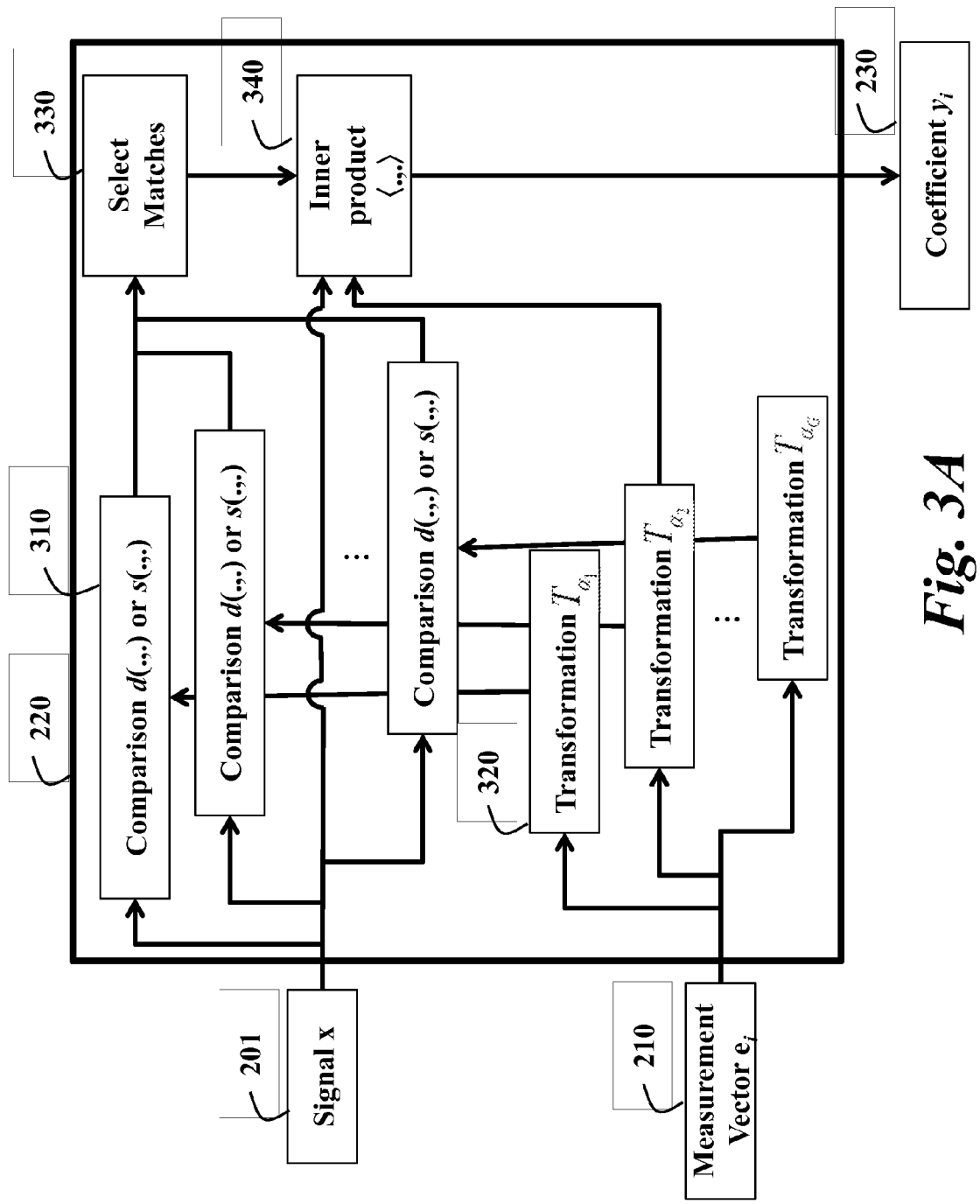
FIGS. 3A and 3B are schematics of the process to extract a single coefficient or feature according to embodiments of this invention.

FIG. 3A shows by example how the grid points are used transform each measurement vector 210, with multiple transformations, one for each grid point. In particular, for each grid point, a transformation $T_{\alpha_j}$, j=1, ..., G, 320 is used to transform the measurement vector $e_i$. Each transformed measurement vector is compared 310 with the signal 201 using the similarity or the dissimilarity metric. Matches are selected and the inner product of the signal with the matching transformed measurement vector is determined 340. In the preferred embodiments the matches are selected to be the best matches according to the selected metric is 330. However, the matches can be, for example, the second or third best match, or more than one matches using different transformations of the same measurement vector. In the example in the figure, the best match is the transformation through $T_{\alpha_j}$. The result of the inner product $y_i$, is the $i^{th}$ coefficient 230 of the embedding 240 y.

Figure 3B:
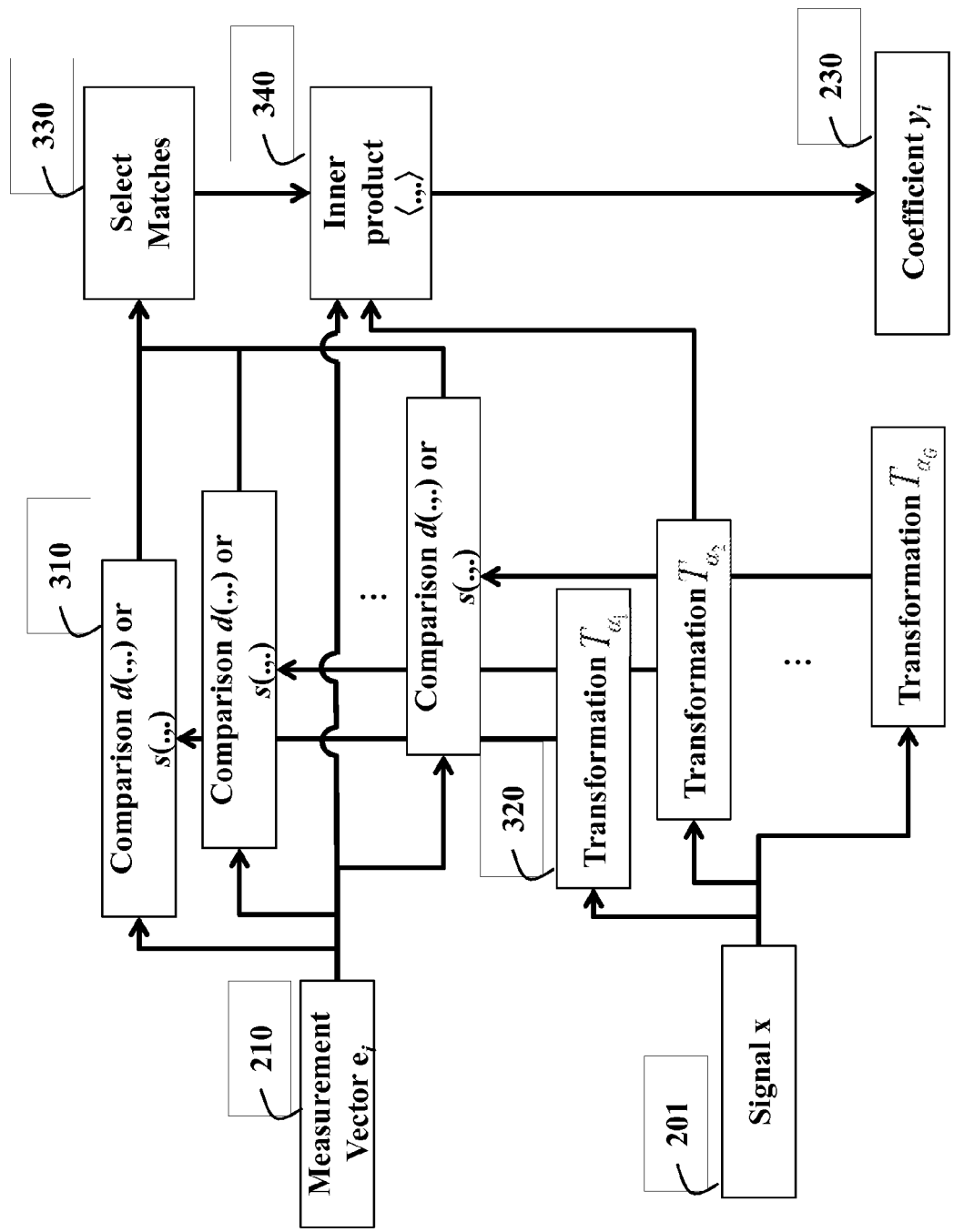

Alternatively or additionally embodiment is shown in FIG. 3B, in which the signal 201 is transformed using each parameter in the transformation 320 and the result is compared with the measurement vector 210 using the similarity or the dissimilarity metric 310. The selected matches 330 are used to compute the inner product of the transformed signal with measurement vector 340 in order to produce the coefficient 230.

The pseudocode for the procedure that determines the embedding according to the schematics of FIGS. 3A and 3B is shown in FIG. 7.

In the preferred embodiment, for each measurement vector, the procedure first determines the transformation in the measurement vector that maximizes its similarity with the signal (step 2). To do so, the procedure minimizes the dissimilarity function $d(\bullet,\bullet)$ or maximizes the similarity function $s(\bullet,\bullet)$, depending on which one is available by the application. Then, the procedure measures the signal using this transformation (step 3). Note that steps 2 and 3 can be replaced by $$\hat{\alpha}_i = \underset{\alpha \in \mathcal{G}}{\arg\min}\, d(T\alpha(x), e_i), \text{ or, } \hat{\alpha}_i = \underset{\alpha \in \mathcal{G}}{\arg\max}\, s(T_\alpha(x), e_i), \text{ and} \quad (8)$$

$$y_i = \langle T_{\hat{\alpha}}(x), e_i \rangle, \quad (9)$$

respectively. In most transformations, but not all, both formulations are equivalent and can be used interchangeably.

The formulation in FIG. 7 corresponds to the embodiment shown in FIG. 3A, and the alternative formulation in (8) and (9) corresponds to the embodiment of FIG. 3B. The pseudocode in FIG. 7 is usually easier to implement in practical systems, especially when measuring a large number of signals.

The main output of the embedding function is the vector of measurements y. Optionally the function also returns the optimal transformation parameters, $\hat{\alpha}$, if the application requires the shifts. In some embodiments, the parameters can be used to reconstruct or approximately reconstruct the signal from the embedding. The parameters can also be used to find the relative transformation of similar signals.

Given two signals x, x' and their embeddings y=E(x), y'=E(x'), their similarity or dissimilarity can then be evaluated using s(y, y') or d(y, y') using an appropriately defined similarity or dissimilarity function in $\mathcal{V}$. This similarity or dissimilarity is approximately representative of the maximum similarity or minimum dissimilarity when comparing all the transformations of x with all the transformations of x', with parameters taken from the parameter set $\mathcal{R}$.

If the embodiment has also preserved the optimal transformation parameters used to compute the embedding, then parameters used to embed the two signals can be compared to produce the optimal transformation that would align or match the signals. For example, the average or the median relative value of the parameters, or the average or the median relative value of the best matching coefficients can be an estimate of the relative transformation one signal should undergo to match the other signal.

The embedding vector can also be quantized to $q=Q(y)$ using an appropriate quantization function. This is very useful if, for example, the embedding should be stored or transmitted, and the bit-rate used needs to be reduced.

A hash of the embedding $h=H(y)$ can also be determined, which can further be a locality sensitive hash (LSH), in order to further improve the speed of signal retrieval based on comparisons with the embedding.

Uses and Protocols

There are several uses of these embeddings. One of the most important is operator-invariant signal retrieval from a database, e.g., a data base of images. In this application, a database of signals is searched, using an operator-invariant method, for signals similar to incoming query signals. The database is prepared using the appropriate operator invariant embedding by determining the embeddings of all the signals in the database and storing the embeddings as indices to the database.

When the query is executed, the embedding of the query signal is first determined. The embedding is compared with the embeddings of all the signals in the database. Depending on the application, the closest match or a number of closest matches are returned, or an indication that a close match is or is not in the database. This is a much faster comparison, when contrasted with the alternative of comparing the query signal with all the transformations of all the signals in the database for all the parameters in the parameter space. The initial computational cost to prepare the database is small, especially when many queries need to be executed.

The query time can be further reduced if from all the signals in the database a locality sensitive hash is determined from their embedding and stored together with the signal and its embedding. When a query is executed, a hash is determined from the embedding using the same hash function. Only the few signals in the database that have the same hash are selected for comparison.

Figure 4:
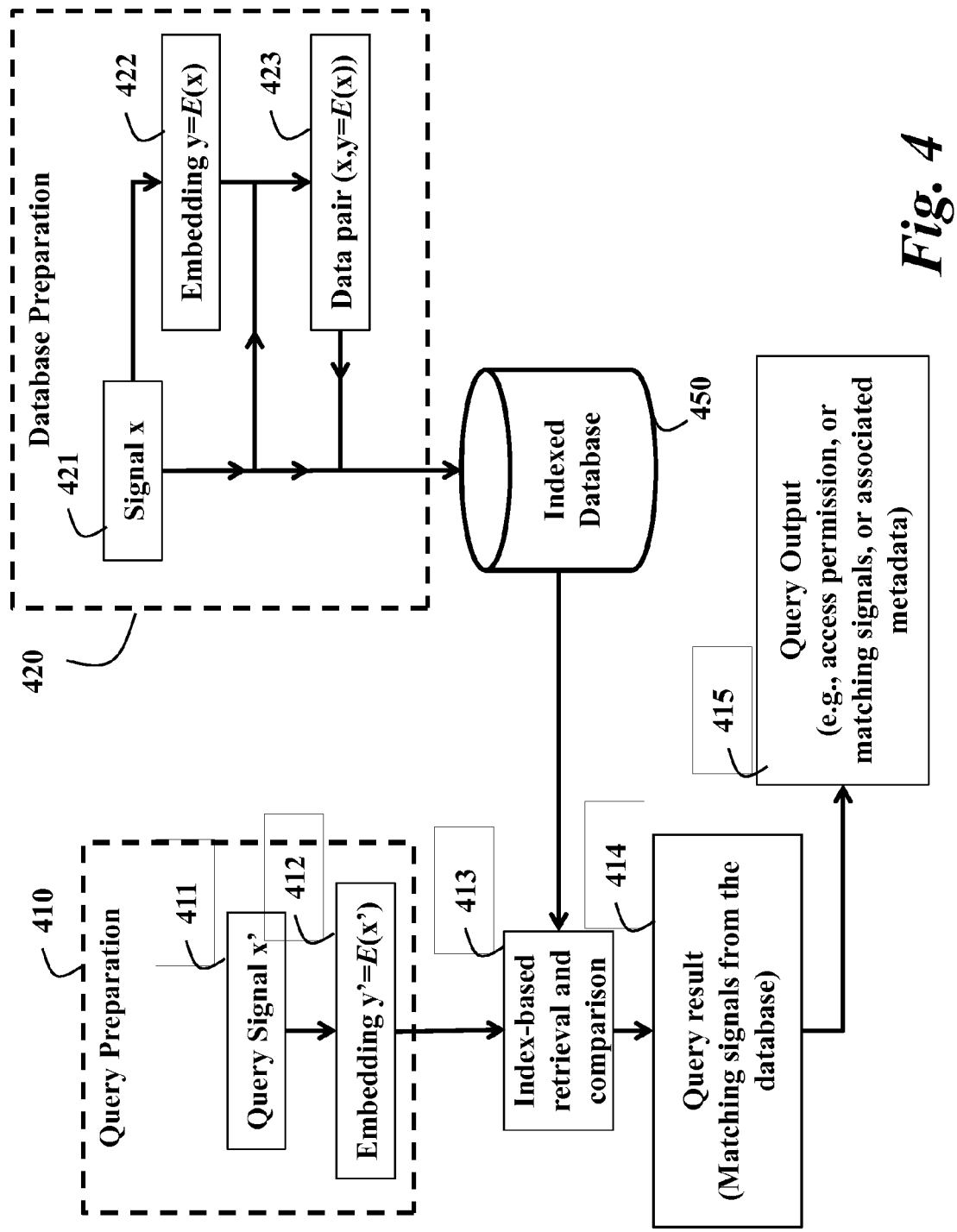
FIG. 4 is a schematic of a signal query execution according to an embodiment of the invention.
Figure 5:
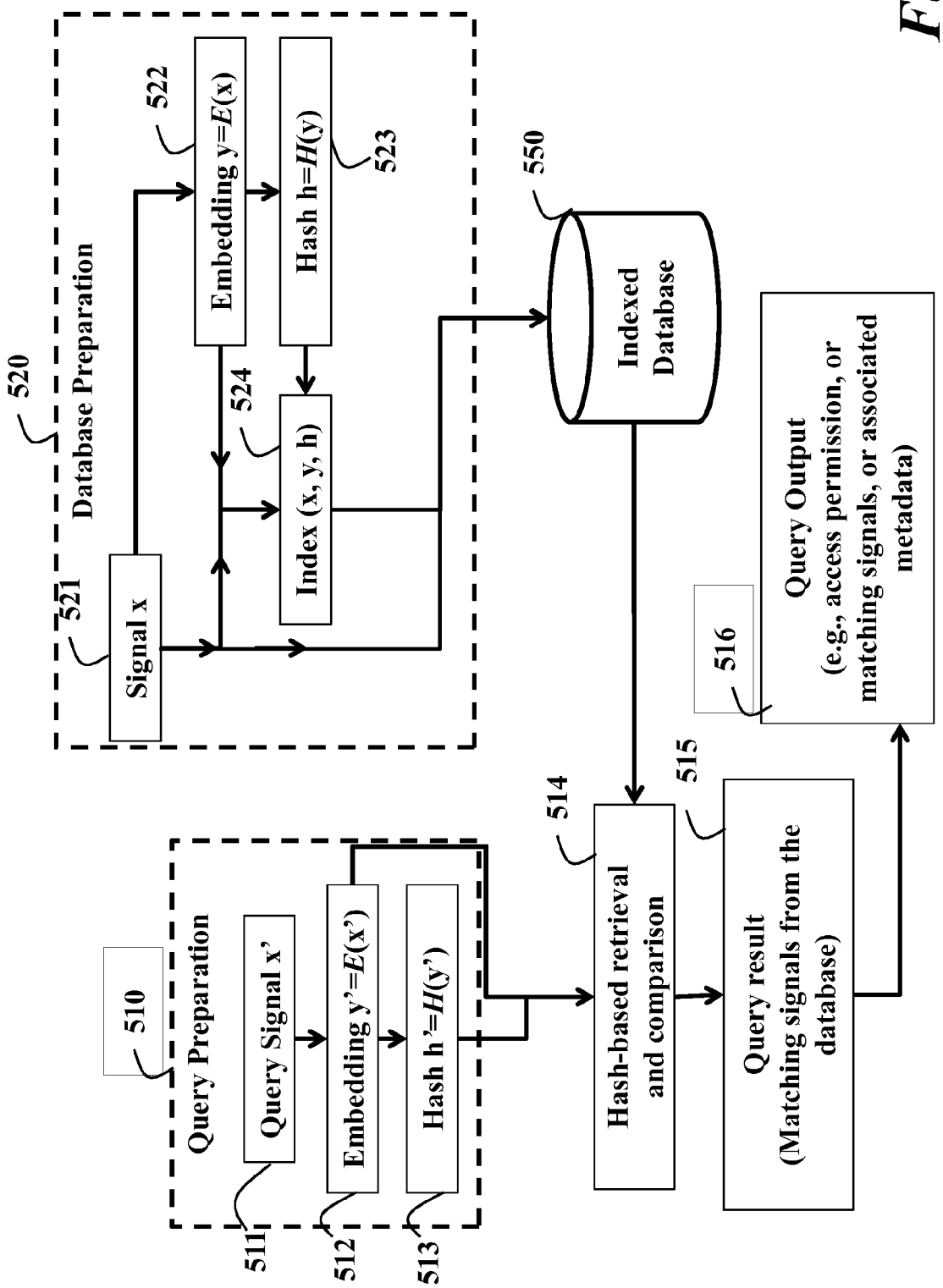
FIG. 5 is a schematic of a signal query execution according to an alternative embodiment of the invention.

FIGS. 4 and 5 schematically show for preparing and querying a database of signals according to embodiments of this invention.

FIG. 4 shows how the embedding described above can be used without hashing to prepare and query a database 450 of signals. The database is first prepared 420 as follows. For each signal x 421 the embedding y is computed 422. The embedding together with the signal forms a pair (x, y) 423. This pair is an index entry. All the index entries are stored in an index which is stored in the database 450 and used to index the database using indexing methods known in the art.

To query the database with a query signal x' 411, a query is prepared 410 by computing the embedding y' 412 of the query signal. The query is executed by comparing 413 the embedding of query signal y' with the embedding y for each of the signals in the database 450. Matching signals are selected as the query result. The best match or several matches comprise a query result 414. These steps can also be performed in the processor connected to the database.

The output of the query 415 is based on the query result. For example, the output can be the matching signals themselves, or metadata associated with the matching signals, or a decision based on the matching signals, such as to allow or disallow access to a user.

FIG. 5 shows how the embedding can be used with hashing to prepare and query a database of signals. Similar to FIG. 4, the database is prepared 520 by first computing 522 the embedding y of each signal x 521. A hash h is computed from the embedding 523. The hashes from all the signals are index entries and are used to build an index 524 for the database 550. The index indexes the signals and their embeddings according to their hash, using indexing methods known in the art.

The query is prepared 510 in a similar fashion. The embedding of the query signal 511 is computed 512 and the hash of the embedding is computed 513. The hash and, in some but not all embodiments, the embedding itself is used to query the database.

The query is executed 514 by retrieving from the index of the database a list of all the signals with the same hash as the query hash. These are all matching signals from the database. If the query embedding is also used in the retrieval, then the embeddings of the retrieved signals can also be compared with the embedding of the query signal to decrease the number of matching signals. The matching signals are the query result 515. In some embodiments multiple hashes can be used to increase the accuracy of the retrieval using methods well known in the art.

Similar to the embodiment in FIG. 4, in this embodiment the output of the query 515 is based on the query result. For example, the output can be the matching signals themselves, or metadata associated with the matching signals, or a decision based on the matching signals, such as to allow or disallow access to a user.

Figure 6:
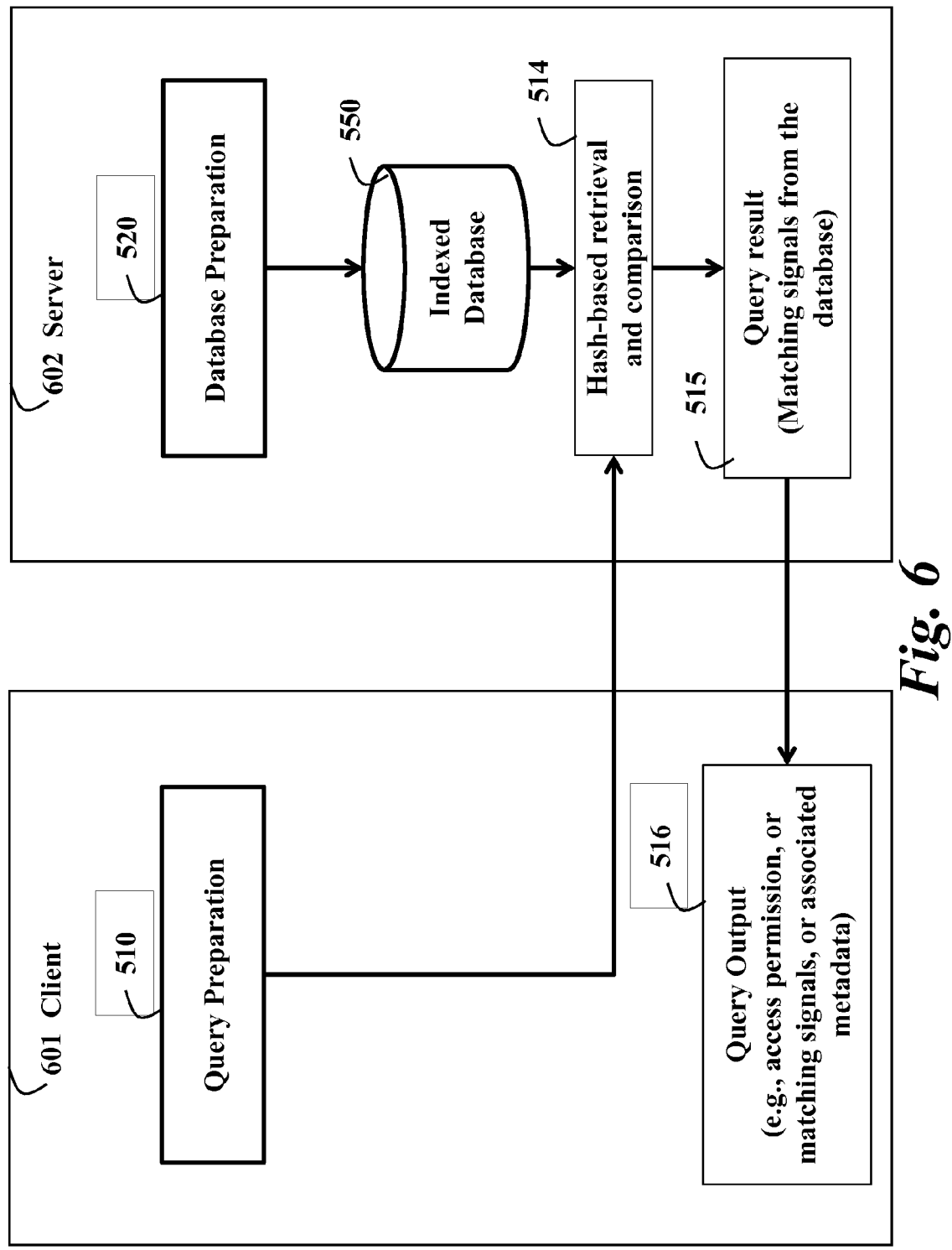
FIG. 6 is a schematic of a client/server query generated remotely according to an alternative embodiment of the invention.

In a preferred embodiment shown in FIG. 6, the query is generated remotely, i.e., there is a client 601 executing the query preparation 510 and querying the database 550 stored at a server 602 using a network. The database is already prepared using the protocol 520 described above. In such cases, the client can transmit the signal, or a compressed version of the signal, and the database follows the protocol above, possibly after decompressing the signal. Alternatively, the client can determine the embedding, quantize the embedding or encode or compress the embedding in some other way, and transmit the embedding to the server to continue the search protocol 514. The server retrieves the matching signals 515 and transmits the query output 516 to the client. While FIG. 6 demonstrates a client/server embodiment using the indexed database described in FIG. 5, it is also possible in a similar manner to implement a client/server embodiment based on the database preparation described in FIG. 4.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

I claim:

1. A method for generating an embedding for a signal, which is invariant to an operator, comprising steps:
    measuring the signal with each vector from a set of measurement vectors to produce a corresponding set of coefficients, wherein the measuring compares and transforms each measurement vector and the signal using the operator;
    selecting a set of one or more matching coefficients according to predefined criteria; and
    combining the matching coefficients to produce the embedding for the signal, wherein the embedding is operator invariant and the steps are performed in a processor.

2. The method of claim 1, further comprising:
    generating the embedding for each of the two signals; and
    comparing the embeddings of the two signals to produce a comparison.

3. The method of claim 1, further comprising:
generating the embedding for each signal stored in a database of signals;
associating each signal with the embedding to produce an index entry; and
storing the index entries to an index table.

4. The method of claim 3, further comprising:
generating the embedding of a query signal;
comparing the embedding of the query signal with the embeddings of the signals stored in the database using the index entries; and
retrieving the signals in the database with matching embeddings that correspond to the embedding of the query signal.

5. The method of claim 1, further comprising:
generating randomly the set of measurement vectors.

6. The method of claim 1, wherein the selecting uses a similarity metric.

7. The method of claim 1, wherein the selecting uses a dissimilarity metric.

8. The method of claim 2, wherein the comparing uses a similarity metric.

9. The method of claim 2, wherein the comparing uses a dissimilarity metric.

10. The method in claim 1, wherein the matching coefficients are best matching coefficients.

11. The methods of claim 7 or 9, wherein the dissimilarity metric computes a distance between two signals.

12. The method of claim 11, wherein the distance is a Euclidian distance.

13. The methods of claim 7 or 9, wherein the dissimilarity metric is a divergence.

14. The method of claim 13, wherein the divergence is a Bregman divergence.

15. The methods of claim 6 or 8, wherein the similarity measure is a correlation.

16. The methods of claim 6 or 8, wherein the similarity measure is a magnitude of a correlation.

17. The methods of claim 6 or 8, wherein the similarity is measured using a similarity kernel.

18. The method of claim 17 wherein the kernel is a radial basis kernel.

19. The method of claim 1, wherein the operator characterizes a shift, a scale a change, or a rotation, and combinations thereof.

20. The method of claim 1, wherein the operator characterizes a transformation of the signal.

21. The method of claim 20, wherein specific properties of the transformation are characterized by parameters.

22. The method of claim 1, wherein a number of the measurement vectors is less than a dimensionality of the signal.

23. The method of claim 1, wherein the measurement vectors are uniformly distributed on a unit sphere in a signal space.

24. The method of claim 1, further comprising:
quantizing the embedding.

25. The methods of claim 1 or 4, wherein the comparing the embedding uses a hash of the embedding.

26. The methods of claim 3, wherein the associating also uses a hash of the embedding to produce index entries.

27. The method of claim 1, wherein the signals are images.

28. The method of claim 1, wherein the signals are generated by sensors.

29. The method of claim 28, wherein the sensors are sensing mechanical systems.

30. The method of claim 29, wherein the mechanical systems are factory equipment.

31. The method of claim 29, wherein the sensors are sensing electrical systems.

32. The method of claim 31, wherein the electrical systems are power storage systems.

33. The method of claim 32, wherein the power storage systems include batteries.

34. The method of claim 4, further comprising:
retrieving metadata associated with the signals stored in the database.

35. A system for generating an embedding for a signal, which is invariant to an operator, comprising:
means for acquiring the signal; and
a processor, connected to the means for measuring, configured to measure the signal with each vector from a set of measurement vectors to produce a corresponding set of coefficients, wherein the measuring compares and transforms each measurement vector and the signal using the operator, and to select a set of one or more matching coefficients according to predefined criteria, and to combine the matching coefficients to produce the embedding for the signal, wherein the embedding is operator invariant.

36. The system of claim 34, wherein the means for acquiring comprises of sensors.

37. The system of claim 34, wherein the processor is a client, wherein the client is configured to generate an embedding of a query signal;
a server including a database storing signals and the embedding of each of the signals;
comparing the embedding of the query signal with the embeddings of all the signals stored in the database; and
retrieving the signals in the database that correspond to the embeddings matching the embedding of the query signal.

* * * * *